(12) United States Patent
Myers et al.

(10) Patent No.: US 7,365,981 B2
(45) Date of Patent: Apr. 29, 2008

(54) FLUID-COOLED ELECTRONIC SYSTEM

(75) Inventors: Bruce A. Myers, Kokomo, IN (US); Darrel E. Peugh, Kokomo, IN (US); Henry M. Sanftleben, Carmel, IN (US)

(73) Assignee: Delphi Technologies, Inc., Troy, MI (US)

( * ) Notice: Subject to any disclaimer, the term of this patent is extended or adjusted under 35 U.S.C. 154(b) by 156 days.

(21) Appl. No.: 11/168,882

(22) Filed: Jun. 28, 2005

(65) Prior Publication Data

US 2006/0291164 A1    Dec. 28, 2006

(51) Int. Cl.
*H05K 7/20* (2006.01)
*H01L 23/12* (2006.01)
*F28F 7/00* (2006.01)

(52) U.S. Cl. .................. 361/699; 361/719; 257/704; 257/710; 165/80.4

(58) Field of Classification Search .............. 361/689, 361/699, 719; 257/675, 704, 710, 714; 174/15.1; 165/80.4; 62/259.2
See application file for complete search history.

(56) References Cited

U.S. PATENT DOCUMENTS

| | | | | |
|---|---|---|---|---|
| 5,239,200 A | * | 8/1993 | Messina et al. | 257/714 |
| 5,443,890 A | * | 8/1995 | Ohman | 428/167 |
| 5,689,089 A | * | 11/1997 | Polak et al. | 174/536 |
| 6,075,289 A | * | 6/2000 | Distefano | 257/732 |
| 6,188,578 B1 | * | 2/2001 | Lin et al. | 361/717 |
| 6,940,712 B2 | * | 9/2005 | Chu et al. | 361/679 |
| 2001/0033477 A1 | * | 10/2001 | Inoue et al. | 361/718 |
| 2003/0090873 A1 | * | 5/2003 | Ohkouchi | 361/704 |
| 2003/0110788 A1 | * | 6/2003 | Koeneman et al. | 62/259.2 |
| 2004/0190251 A1 | * | 9/2004 | Prasher et al. | 361/699 |
| 2005/0128706 A1 | * | 6/2005 | Maly et al. | 361/699 |
| 2006/0002087 A1 | * | 1/2006 | Bezama et al. | 361/699 |
| 2006/0018795 A1 | * | 1/2006 | Potyrailo et al. | 422/100 |
| 2006/0109630 A1 | * | 5/2006 | Colgan et al. | 361/718 |
| 2006/0151203 A1 | * | 7/2006 | Krueger et al. | 174/260 |
| 2006/0157225 A1 | * | 7/2006 | Martin et al. | 165/80.4 |
| 2006/0285300 A1 | * | 12/2006 | Brandenburg et al. | 361/720 |

* cited by examiner

*Primary Examiner*—Anatoly Vortman
*Assistant Examiner*—Bradley H Thomas
(74) *Attorney, Agent, or Firm*—Jimmy L. Funke

(57) ABSTRACT

A fluid-cooled electronic assembly including a base having a fluid inlet and a fluid outlet therein, a cap attached to the base to form a fluid containment chamber therebetween, wherein the fluid containment chamber is in fluid communication with the fluid inlet and the fluid outlet, and an electronic device disposed within the fluid containment chamber and connected to the base, the electronic device having a plurality of microchannels adapted to receive a cooling fluid flow therethrough, wherein the cap is shaped to direct a fluid flow from the fluid inlet to the microchannels such that a pressure drop between the fluid inlet and the fluid outlet is reduced.

8 Claims, 5 Drawing Sheets

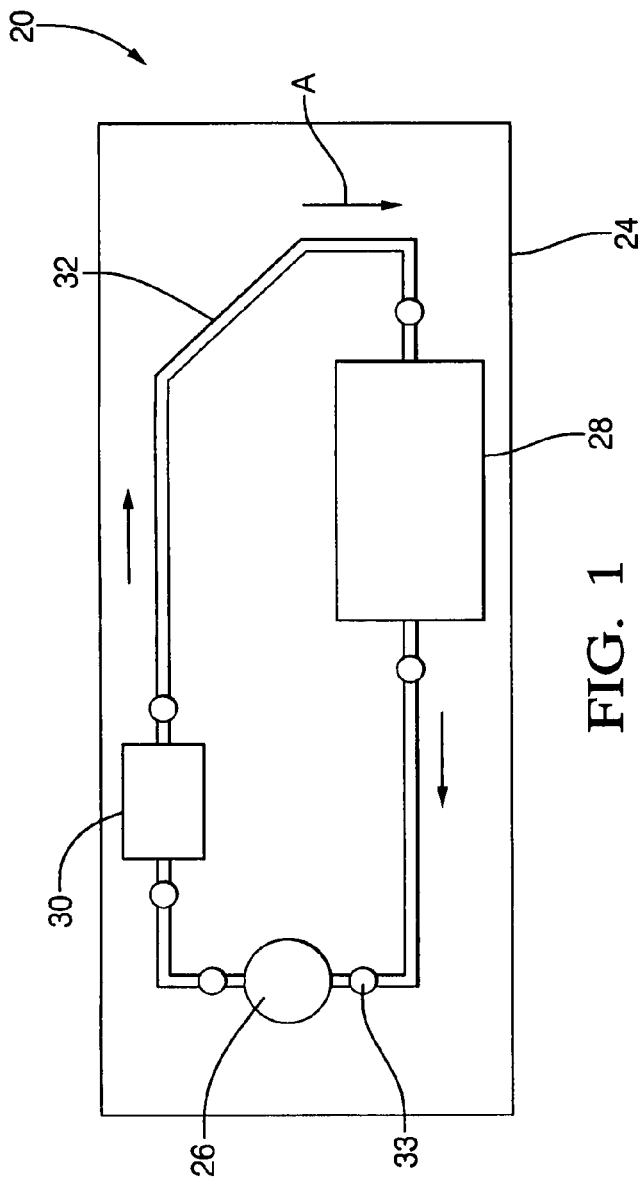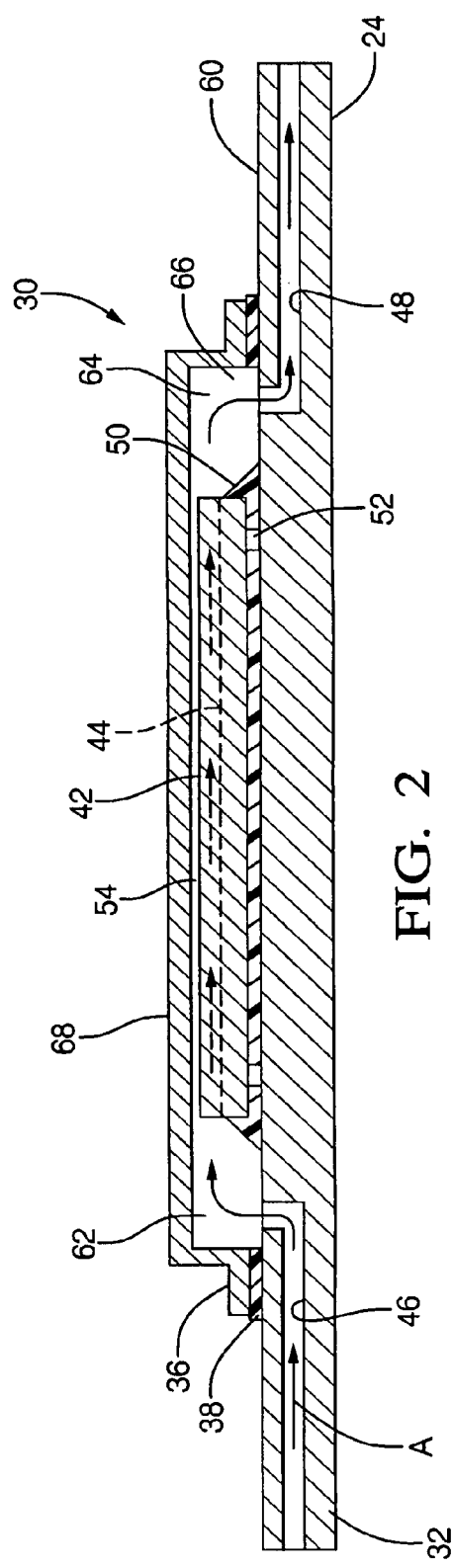

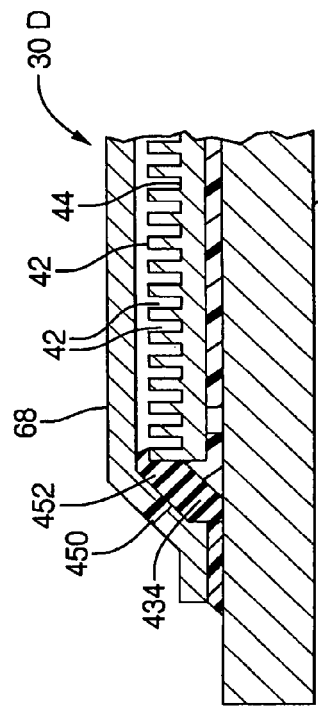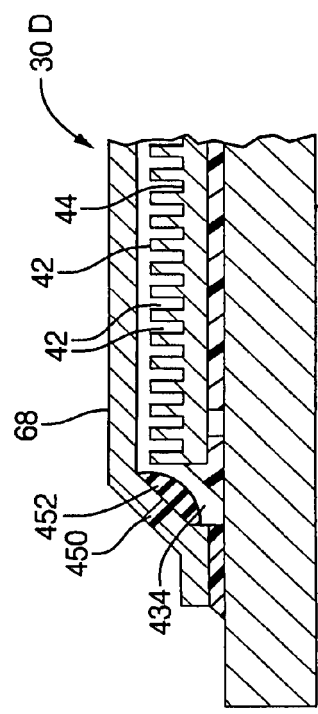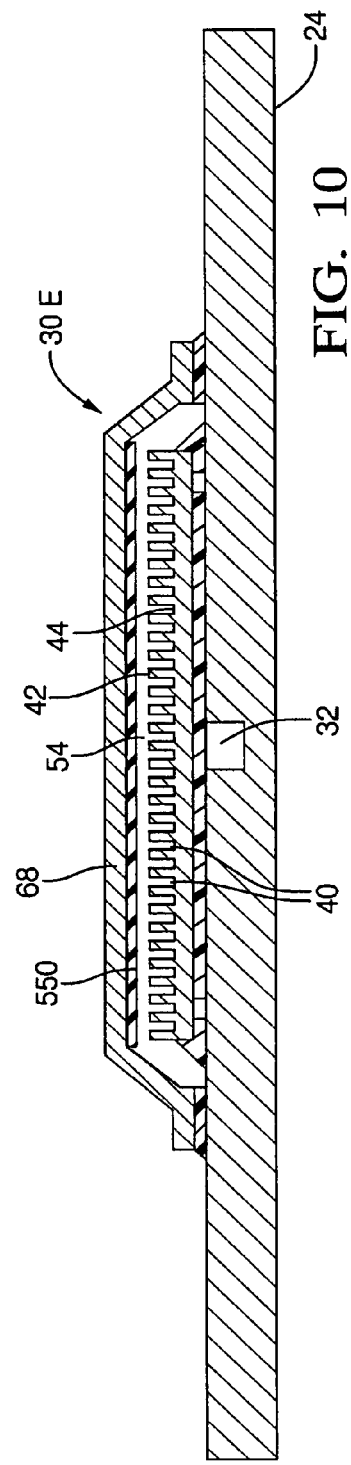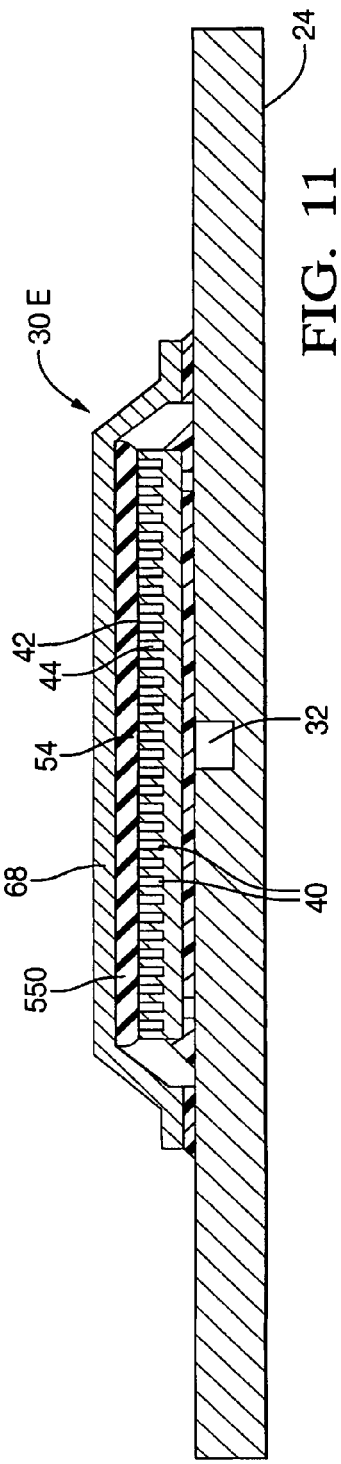

FLUID-COOLED ELECTRONIC SYSTEM

BACKGROUND

The present application relates to a cooling system and, more particularly, an apparatus and method for cooling an electronic device.

Electronic devices typically generate large amounts of heat during operation. Such devices may include power supplies, personal computers, servers, power converters for hybrid vehicles, start-stop generators and various automotive systems. If this heat cannot be effectively removed, temperatures may rise to levels that prevent normal function, possibly leading to failure. This issue is especially relevant for electronic devices operating in high temperature environments, such as near the engine of an automobile.

Heat may be transferred from an electronic device by conduction, radiation, evaporation, convection or some combination of these mechanisms. Convection typically refers to a circulating fluid (e.g., a liquid or gas) that absorbs and carries away heat from the surface of an object.

Convective cooling may be implemented as an open loop system or a closed loop system. In an open loop system, the moving fluid absorbs heat and then is discarded and replaced with fresh fluid. In a closed loop system, a circulating fluid flows over a hot surface, passes through a heat exchanger to cool the fluid, and then is recirculated to the hot surface.

An integrated circuit, such as a flip chip, may be cooled using convective cooling, as described in U.S. Ser. No. 10/919,168, the entire contents of which are incorporated herein by reference. Specifically, the flip chip may be attached to a printed circuit board and may include a plurality of microchannels on a surface thereof. A tiny cap may be attached to the circuit board to enclose the flip chip therebetween and form a fluid containment around the flip chip. A cooling fluid may be passed through the fluid containment such that the fluid passes over the microchannels to cool the flip chip.

Unfortunately, a significant portion of the cooling fluid may bypass the microchannels and, instead, flow through a gap between the inside of the cap and the top and sides of the chip, thereby reducing the heat transfer from the chip to the cooling fluid. Such gaps are practically unavoidable given the required tolerances for assembling such components.

Accordingly, there is a need for a fluid-cooled electronic system for directing cooling fluid into the microchannels of an electronic device, thereby by improving the heat transfer between the electronic device and the cooling fluid.

SUMMARY

In one aspect, the disclosed fluid-cooled electronic system may provide an electronic assembly including a base having a fluid inlet and a fluid outlet therein, a cap attached to the base to form a fluid containment chamber therebetween, wherein the fluid containment chamber is in fluid communication with the fluid inlet and the fluid outlet, and an electronic device disposed within the fluid containment chamber and connected to the base, the electronic device having a plurality of microchannels adapted to receive a cooling fluid flow therethrough, wherein the cap is shaped to direct a fluid flow from the fluid inlet to the microchannels such that a pressure drop between the fluid inlet and the fluid outlet is reduced.

In another aspect, the disclosed fluid-cooled electronic system may provide an electronic assembly including a base having a fluid inlet and a fluid outlet therein, a cap attached to the base to form a fluid containment chamber therebetween, wherein the fluid containment chamber is in fluid communication with the fluid inlet and the fluid outlet, an electronic device disposed within the fluid containment chamber and connected to the base, and an obstructing material disposed within the fluid containment chamber between the cap and the electronic device, the obstructing material positioned to divert fluid flow through the fluid containment chamber.

In another aspect, the disclosed fluid-cooled electronic system may provide an electronic assembly including a base having a fluid inlet and a fluid outlet therein, a cap attached to the base to form a fluid containment chamber therebetween, wherein the fluid containment chamber is in fluid communication with the fluid inlet and the fluid outlet, an electronic device disposed within the fluid containment chamber and connected to the base, the electronic device having a plurality of microchannels adapted to receive a cooling fluid flow therethrough, wherein the cap is shaped to direct a fluid flow from the fluid inlet to the microchannels such that a pressure drop between the fluid inlet and the fluid outlet is reduced, and an obstructing material disposed within the fluid containment chamber between the cap and the electronic device, the obstructing material positioned to encourage fluid flow through the microchannels.

Other aspects of the fluid cooled electronic system will become apparent from the following description, the accompanying drawings and the appended claims.

BRIEF DESCRIPTION OF THE DRAWINGS

FIG. 1 is a diagram of one aspect of the disclosed fluid-cooled electronic system;

FIG. 2 is a front elevational view, in section, of a first aspect of an electronic assembly of the fluid-cooled electronic system of FIG. 1;

FIG. 8 is a partial front elevational view, in section, of the electronic assembly of FIG. 7, before the introduction of fluid;

FIG. 9 is a partial front elevational view, in section, of the electronic assembly of FIG. 7, after the introduction of fluid;

FIG. 10 is a front elevational view, in section, of a sixth aspect of the electronic assembly of FIG. 2, before the introduction of fluid; and FIG. 11 is a front elevational view, in section, of the electronic assembly of FIG. 8, after the introduction of fluid.

DETAILED DESCRIPTION

Figure 3:
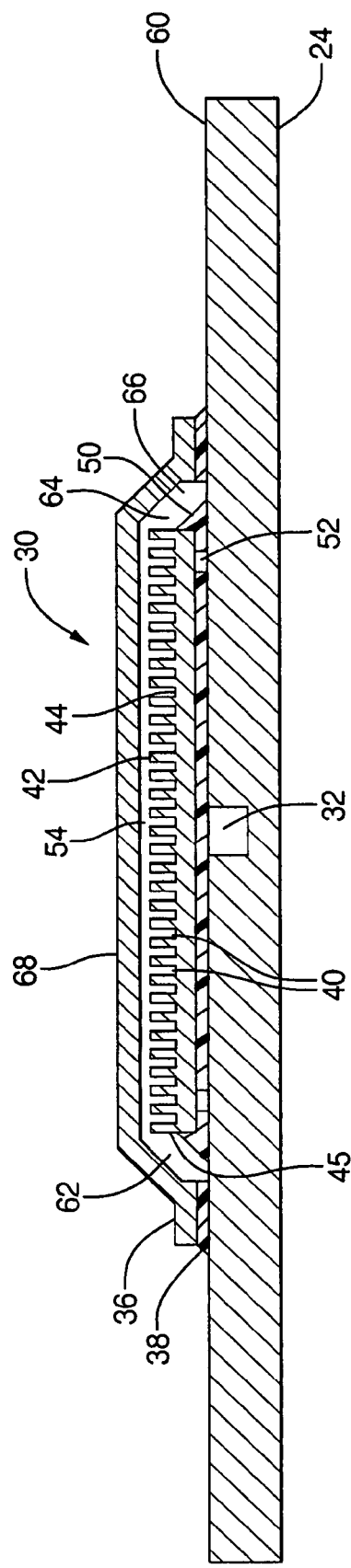
FIG. 3 is a side elevational view, in section, of the electronic assembly of FIG. 2.

As shown in FIG. 1, one aspect of the fluid cooled electronic system, generally designated 20, includes a base 24, a pump 26, a heat exchanger 28 and an electronic assembly 30. A fluid line 32 may interconnect the pump 26, the heat exchanger 28 and the electronic assembly 30 such that the pump 26 may circulate a cooling fluid through the fluid line 32 in the direction shown by arrow A. Additionally, the system 20 may include at least one access port 33 for introducing cooling fluid into the system 20 from an outside source.

As the pump 26 circulates the cooling fluid through the system 20, heat generated by electronic assembly 30 may be transferred to the cooling fluid and dissipated at the heat exchanger 28. The heat exchanger 28 may transfer accumulated heat to the base 24, which may serve as a heat sink.

The cooling fluid may be a liquid, a gas or a combination of liquids and/or gases. For example, the cooling fluid may be water, liquid silicone, a hydrocarbon, a glycol or an ether florinert. Any fluid capable of being pumped through system 20 may be chosen, so long as the fluid is compatible with the system 20.

The base 24 may be a printed circuit board that is conventionally made from any one of a number of materials, including, but not limited to, paper phenolic, glass fiber epoxy, copper layers, component layers and masking layers. In one aspect, the base 24 may be made of multiple layers of materials such as low temperature co-fired ceramics (LTCC) or high-temperature co-fired ceramics (HTCC). During the assembly process, the passive elements, such as resistors, capacitors and inductors, may be embedded within the ceramic layers to form a ceramic interconnect module.

As shown in FIGS. 2 and 3, the electronic assembly 30 may include an electronic device 44 and a fluid containment cap 68. The electronic device 44 may be a flip chip or the like and may have a thickness of about 0.01 inches to about 0.25 inches and a width and length of about 0.1 to about 0.5 inches, although these dimensions may vary widely depending on the application. The electronic device 44 may include a plurality of microchannels and fins 40 adapted to facilitate heat transfer between the electronic device 44 and the fluid. The microchannels 40 may be parallel and spaced apart.

The electronic device 44 may be attached to the base 24 by an attachment 52. The attachment 52 may be solder, an adhesive or the like. A filler material 50 may be provided to fill the space between the bottom of the electronic device 44 and the top surface 60 of the base 24, and may cover the electrical connections on the bottom of electronic device 44. The filler material 50 may be silica or non-silica filled epoxies, thermally cured silicones or the like.

The fluid containment cap 68 may be attached to the base 24 to form a fluid containment chamber 66, wherein the electronic device 44 is positioned within the fluid containment chamber 66. The cap 68 may be made from various metallic, ceramic and/or polymeric materials. For example, the cap 68 may be made from aluminum, copper or a rigid plastic. The cap 68 may include a flange 36 attached to the base 24 to form a seal 38 therebetween. The seal 38 may be a solder, an adhesive or the like.

The fluid containment chamber 66 may include an inlet chamber 62 disposed over a fluid inlet channel 46 of fluid line 32 and an outlet chamber 64 disposed over a fluid outlet channel 48 of fluid line 32. Fluid may also flow through a gap 54 between a top surface 42 of the electronic device 44 and the cap 68 and between a side surface 45 and the cap 68 (see FIG. 3), thereby diverting the fluid flow away from the microchannels 40 and reducing the heat transfer efficiency of the system 20. Fluid flow through the gap 54 may result in a significant pressure and flow rate drop of the fluid, thereby reducing the heat transfer rate from the electronic device 44 to the fluid.

Each microchannel 40 may have a depth that is about 5 to about 90 percent of the depth of the electronic device 44. For example, the microchannels 40 may have a depth approximately in the range of about 50 to about 800 microns and a width approximately in the range of about 80 to about 500 microns. Microchannels 40 may provide an increased surface area of electronic device 44 for convective heat transfer to the fluid. Microchannels 40 may be formed within the substrate material of the electronic device 44 by, for example, using a diamond saw blade, dry etching, wet etching or the like.

Figure 4:
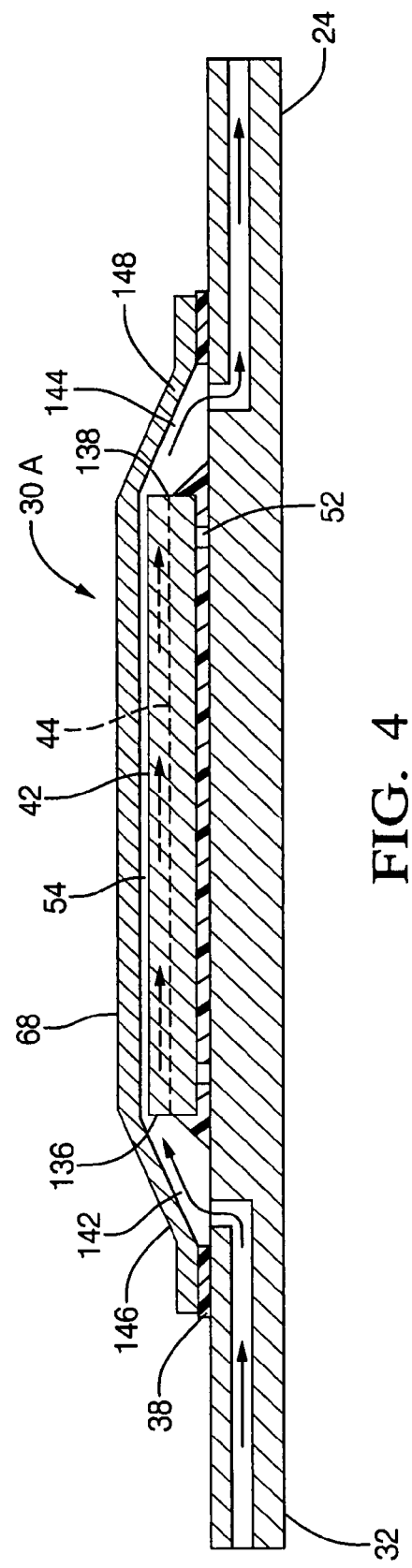
FIG. 4 is a front elevational view, in section, of a second aspect of the electronic assembly of FIG. 2.

In another aspect, as shown in FIG. 4, the cap 68 of electronic assembly 30A may include a contoured fluid inlet chamber 142 formed by an angled corner 146 of the cap 68 and a contoured fluid outlet chamber 144 formed by an angled corner 148 of the cap 68. Thus, fluid from a fluid line 32 may enter the contoured fluid inlet chamber 142 and flow directly into the microchannel inlet 136 of electronic device 44 and out of the microchannels 40 (not shown in FIG. 4) of device 44 by way of microchannel outlet 138 and into contoured fluid outlet chamber 144.

The fluid flow inside of fluid inlet chamber 142 and fluid outlet chamber 144 may be less turbulent due to the angled corners 146, 148, thereby decreasing undesirable pressure and flow rate drops.

Figure 5:
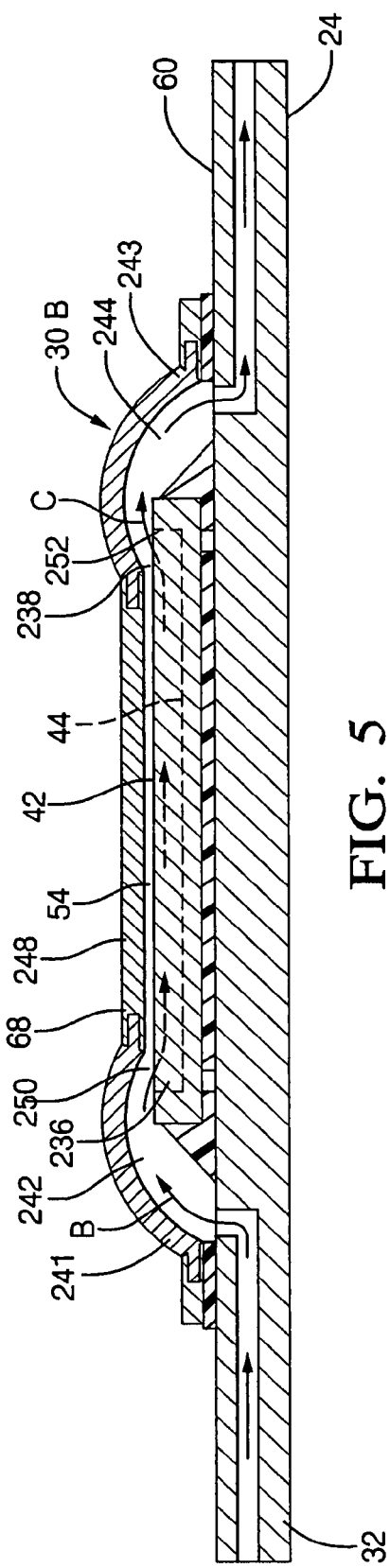
FIG. 5 is a front elevational view, in section, of a third aspect of the electronic assembly of FIG. 2.

In another aspect, as shown in FIG. 5, the cap 68 of electronic assembly 30B may include arcuate-shaped corners 241, 243 that arc above the top surface 248 of the cap 68 forming passages 250, 252 above the top surface 42 of device 44. The passages 250, 252 are part of an arcuate-shaped fluid inlet chamber 242 and an arcuate-shaped fluid outlet chamber 244. An upwardly-facing inlet 236 and an outlet 238 positioned on a top surface 42 of the electronic device 44 provide fluid access to the microchannels 40 of the device 44.

Accordingly, as fluid from fluid line 32 enters the arcuate-shaped inlet chamber 242, the fluid curves along the arcuate shape of fluid inlet chamber 242, as shown by arrow B, through passage 250 and downwardly into the microchannel inlet 236. Similarly, fluid exits the microchannel outlet 238 upwardly into passage 252, moving thereafter along arcuate-shaped fluid outlet chamber 244, as shown by arrow C, and smoothly exits the assembly 30B, thereby providing a reduced pressure drop and an increased fluid flow rate.

Figure 6:
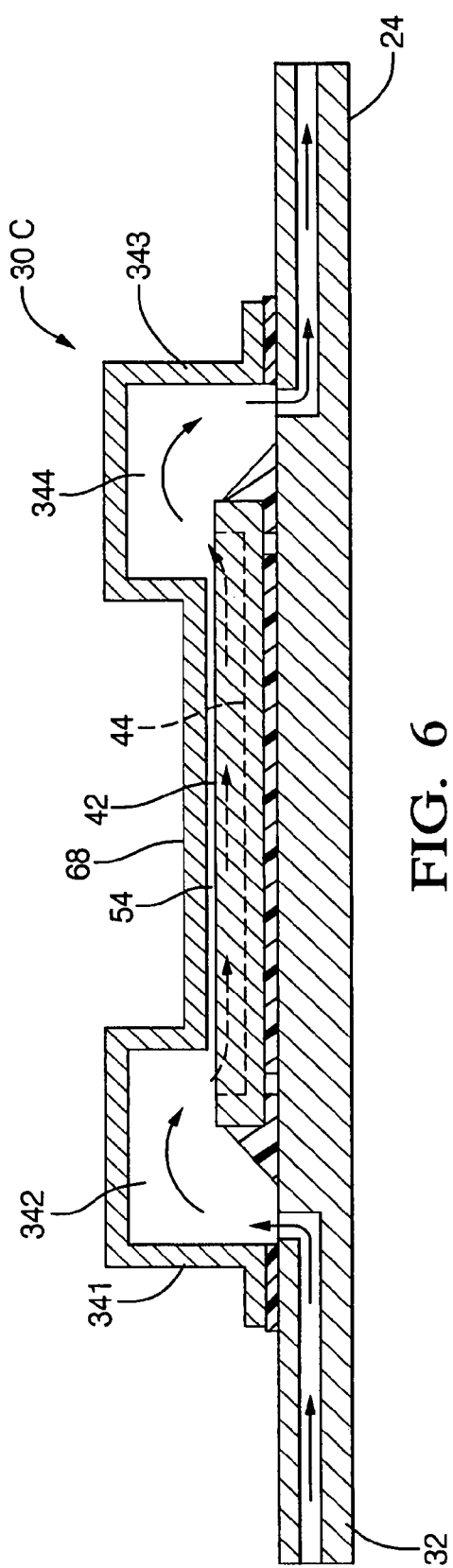
FIG. 6 is a front elevational view, in section, of a fourth aspect of the electronic assembly of FIG. 2.

In another aspect, shown in FIG. 6, assembly 30C includes raised generally rectangular corners 341, 343, rather than the arcuate corners 241, 243 of FIG. 5. The generally rectangular corners 341, 343 may provide an oversized fluid inlet chamber 342 and outlet chamber 344, thereby reducing turbulence and increasing fluid flow through the assembly 30C.

As described above, fluid flow through gap 54 decreases fluid flow through the microchannels 40, thereby reducing the overall heat transfer from the electronic device 44 to the fluid. Thus, by improving the fluid path from the fluid line 32 to the microchannels 40 of the device 44, as shown in FIGS. 4-6, turbulence may be reduced, thereby increasing fluid flow and heat transfer.

Figure 7:
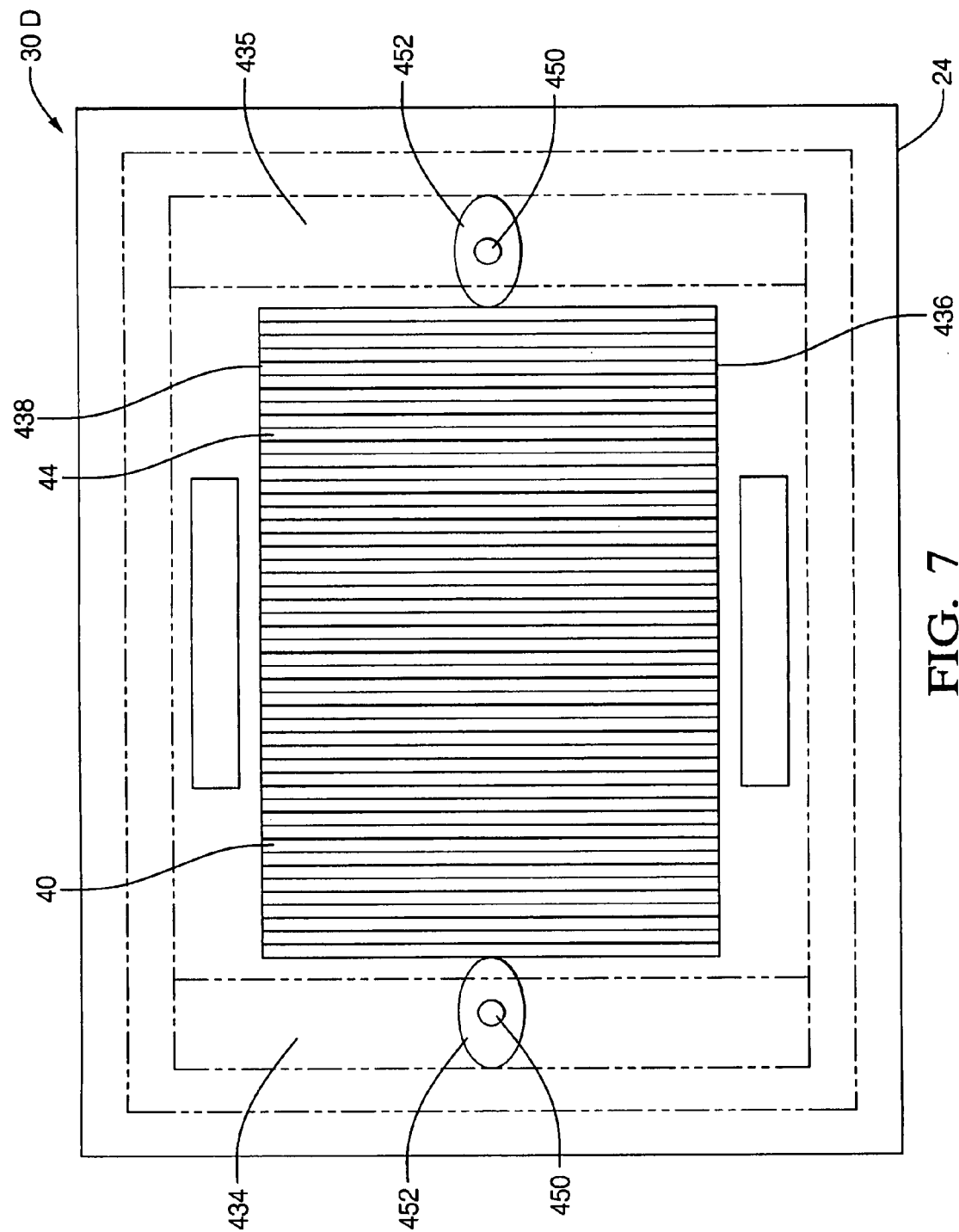
FIG. 7 is a top plan view of a fifth aspect of the electronic assembly of FIG. 2.

In another aspect, as shown in FIGS. 7-9, the electronic assembly 30D may include a baffle material 452 positioned within gaps 434, 435 on each side of the electronic device 44. The baffle material 452 may be any one of a variety of filler materials. For example, baffle material 452 may be a silica-filled epoxy or a thermally cured silicone.

In one aspect, the baffle material 452 may be flowable and may be inserted (e.g., by injection) into the gaps 434, 435 through fill holes 450 in the fluid containment cap 48. The baffle material 452 may entirely fill or only partially fill the gaps 434, 435. Once the material 452 is positioned within the gaps 434, 435, the material may be cured or allowed to set into a non-flowable state.

In another aspect, the baffle material 452 may be a swellable material, wherein the baffle material 452 has a first volume when not swollen, as shown in FIG. 8, and a second (i.e., larger) volume when contacted with an appropriate fluid. When an appropriate fluid flows through the assembly 10, the fluid may swell the swellable baffle material 452 to create a fluid barrier. Appropriate swellable materials and corresponding cooling fluids are discussed in greater detail below.

Thus, the baffle material 452 may inhibit fluid flow through the gaps 434, 435, thereby encouraging the fluid to enter the microchannel inlet 436 and flow through the microchannels 40 and exit from the microchannel outlet 438 (see FIG. 7), thereby improving heat transfer from the device 44 to the fluid.

In another aspect, as shown in FIGS. 10 and 11, the electronic assembly 30E may include a baffle material 550 secured to the inside surface of cap 68 to obstruct fluid flow through the gap 54 between the top surface 42 of the electronic device 44 and cap 68 (see FIG. 10). Baffle material 550 may be the same material as baffle material 452.

In one aspect, the baffle material 550 may be, for example, a silicone dimethyl elastomer such as 3-4207 or a perfluoroether such as SIFEL 614. The selection of material used as baffle material 550 may depend largely upon the cooling fluid used, particularly if the fluid is intended to swell the baffle material 550. For example, a silicone dimethyl elastomer may swell approximately 200-300% when exposed to a silicone based cooling fluid or a hydrocarbon cooling fluid. A perfluoroether may swell approximately 280-400% when exposed to an ether florinert cooling fluid. Poly(acrylic acid) polymer gels may swell greater than 100% when exposed to water.

Thus, baffle material 550 may be a flexible sheet attached to, or positioned in the vicinity of, for example, the inside of cap 68 or a top surface 42 of the electronic device 44 prior to assembly of the cap 68 to the base 24. Alternately, a sheet of baffle material 550 may be loosely retained between the top surface 42 of the electronic device 44 and cap 68 during assembly of the cap 68 to the base 24.

FIG. 10 illustrates the electronic assembly 30E prior to the introduction of cooling fluid, wherein baffle material 550 is in a contracted (i.e., not swollen/expanded) state. When an appropriate fluid is introduced into the assembly 30E, the baffle material 550 may expand (i.e., increase in size), as shown in FIG. 11 to inhibit the flow of fluid through the gap 54, thereby directing fluid flow through the microchannels 40 and increasing heat transfer efficiency.

Although the fluid cooled electronic system has been shown and described with respect to certain aspects, it should be understood that modifications may occur to those skilled in the art upon reading the specification. The fluid cooled electronic system includes all such modifications and is limited only by the scope of the claims.

What is claimed is:

1. A fluid-cooled electronic system comprising:
 a base including a fluid inlet and a fluid outlet;
 an electronic device connected to said base between said fluid inlet and said fluid outlet, said electronic device including a plurality of microchannels extending substantially parallel to a fluid line between said fluid inlet and said fluid outlet;
 a cap attached to said base about said electronic device, said fluid inlet, and said fluid outlet to form a fluid containment chamber that receives cooling fluid through said fluid inlet for cooling said electronic device and exhausts said cooling fluid through said fluid outlet, said cap being peripherally spaced from said electronic device to define a fluid inlet volume between said fluid inlet and an inlet of said microchannels, a fluid outlet volume between said fluid outlet and an outlet of said microchannels, side gaps between said cap and each side of said electronic device, and a top gap between said cap and a top surface of said electronic device; and
 a first baffle material disposed in said top gap, said first baffle material having a contracted state when not exposed to said cooling fluid and a swollen state when exposed to said cooling fluid for restricting a flow of said cooling fluid through said top gap and thereby increasing a proportion of said cooling fluid that flows through said microchannels.

2. The fluid-cooled electronic assembly of claim 1, further comprising:
 a second baffle material disposed in said side gaps for restricting a flow of said cooling fluid through said side gaps and thereby increasing a proportion of said cooling fluid that flows through said microchannels.

3. The fluid-cooled electronic assembly of claim 2, wherein said second baffle material is a curable material that is dispensed into said side gaps.

4. The fluid-cooled electronic assembly of claim 2, wherein said second baffle material is a swellable material that has a contracted state when not exposed to said cooling fluid and an expanded state when exposed to said cooling fluid for restricting the flow of said cooling fluid through said side gaps.

5. The fluid-cooled electronic assembly of claim 1, wherein said first baffle material is a sheet of material that is attached to the top surface of said electronic device.

6. The fluid-cooled electronic assembly of claim 1, wherein said first baffle material is a sheet of material that is attached to an inside surface of said cap.

7. The fluid-cooled electronic assembly of claim 1, wherein a periphery of said cap is contoured such that said fluid inlet volume bulges outwardly in a direction away from said base and then inwardly toward said electronic device to direct said cooling fluid into said microchannels.

8. The fluid-cooled electronic assembly of claim 1, wherein a periphery of said cap is contoured such that said fluid inlet volume angles between said base and a top edge of said electronic device to direct said cooling fluid into said inlet of said microchannels.

* * * * *